US007714428B2

(12) United States Patent
Lee et al.

(10) Patent No.: US 7,714,428 B2
(45) Date of Patent: May 11, 2010

(54) HIGH POWER SEMICONDUCTOR PACKAGE AND METHOD OF MAKING THE SAME

(75) Inventors: Keun-hyuk Lee, Bucheon-si (KR); Seung-won Lim, Bucheon-si (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 230 days.

(21) Appl. No.: 11/951,634

(22) Filed: Dec. 6, 2007

(65) Prior Publication Data
US 2008/0136015 A1    Jun. 12, 2008

(30) Foreign Application Priority Data
Dec. 7, 2006    (KR) ............... 10-2006-0124110

(51) Int. Cl.
*H01L 23/02*    (2006.01)
(52) U.S. Cl. ............... 257/693; 257/E23.098; 361/767
(58) Field of Classification Search .......... 257/691, 257/693, 712, E21.511, E23.098, E23.109, 257/E23.188, E23.189; 361/767, 772; 438/122
See application file for complete search history.

(56) References Cited

U.S. PATENT DOCUMENTS

| 5,306,948 | A | * | 4/1994 | Yamada et al. ............... 257/690 |
| 5,471,089 | A | | 11/1995 | Nagatomo et al. |
| 5,513,072 | A | | 4/1996 | Imaji et al. |
| 5,519,252 | A | | 5/1996 | Soyano et al. |
| 5,521,437 | A | | 5/1996 | Oshima et al. |
| 6,002,166 | A | | 12/1999 | Noda et al. |

* cited by examiner

*Primary Examiner*—Thomas L Dickey
(74) *Attorney, Agent, or Firm*—Hiscock & Barclay, LLP

(57) ABSTRACT

A high power semiconductor package includes a substrate including a base metal layer, a base insulation layer formed on the base metal layer, and a plurality of conductive patterns formed on the base insulation layer. In one embodiment one or more high power semiconductor chips are mounted on the substrate, each including a plurality of bonding pads, one or more first package leads having end portions that are electrically connected to the corresponding conductive patterns, and a second lead having an end portion electrically which may be connected to either the base insulation layer or the base metal layer.

16 Claims, 3 Drawing Sheets

HIGH POWER SEMICONDUCTOR PACKAGE AND METHOD OF MAKING THE SAME

CROSS-REFERENCE TO RELATED PATENT APPLICATIONS

This application claims the benefit of Korean Patent Application No. 10-2006-0124110, filed on Dec. 7, 2006, in the Korean Intellectual Property Office, the disclosure of which is incorporated herein in its entirety by reference.

BACKGROUND OF THE INVENTION

1. Field of the Invention

The present invention relates to a semiconductor package, and more particularly, to a high power semiconductor package generating a lot of heat.

2. Description of the Related Art

Electric power devices, for example, silicon-controlled rectifiers (SCRs), power transistors, insulated-gate bipolar transistors (IGBTs), MOS transistors, power rectifiers, electric power regulators, inverters, converters, or high power semiconductor chips combining the above listed devices are designed to operate within a voltage range of 30V through 1000V or higher. The high power semiconductor chips operate at high voltages unlike low power semiconductor chips such as logic devices or memory devices, and thus, generally are required to have a high heat dissipation efficiency for dissipating heat generated from the high power semiconductor chip and also to have a high electrical insulation property under high operational voltages.

FIG. 1 is a cross-sectional view of a conventional high power semiconductor package 100.

Referring to FIG. 1, a substrate 40 in the high power semiconductor package 100 can include a base metal layer 10 for transmitting the heat to a heat dissipation plate 80, a base electrical insulation layer 20 formed on the base metal layer 10, and a conductive pattern 30 formed on the base insulation layer 20. A high power semiconductor chip 50a and/or a low power semiconductor chip 50b can be mounted on the substrate 40. An insulation member 52 for insulating the conductive pattern 30 from the low power semiconductor chip 50b can be disposed between the conductive pattern 30 and the low power semiconductor chip 50b.

Wire bonding pads 51 that are electrically connected to corresponding conductive patterns 30 can be formed on the high power semiconductor chip 50a and the low power semiconductor chip 50b.

In general, the wire bonding pads 51 of the high power semiconductor chip 50a and the low power semiconductor chip 50b are electrically connected to the conductive patterns 30 by bonding wires 70. After the wire bonding process, the conductive patterns 30 are connected to leads 60 which form external terminals of the semiconductor package 100 and the high power semiconductor package 100 is completed by performing a transfer molding process using a molding material such as an epoxy molding compound (EMC).

In general, the high power semiconductor package 100 generates a lot of heat during operating, and thus, the heat dissipation plate 80 is attached onto the base metal layer 10. The heat dissipation plate 80 is generally formed of a metal having superior thermal conductivity. The heat dissipation plate 80 can be attached onto the base metal layer 10 using an attachment member 85 such as a heat-resistant grease.

FIG. 2 is a schematic side view illustrating a circuit for electrical insulation testing of the high power semiconductor package 100 of FIG. 1.

The high power semiconductor chip 50a operates at the high voltage, for example 600V or higher, in a normal operation mode, and the base electrical insulation layer 20 that insulates the conductive patterns 30 from the base metal layer 10 is required to have high voltage electrical insulating properties. In order to evaluate the insulation property of the base insulation layer 20, the high power semiconductor package 100 undergoes the electrical insulation tests.

When the heat dissipation plate 80 is attached to the high power semiconductor package 100, the electrical insulation test can be performed by checking whether an electric current flows between the heat dissipation plate 80 and the leads 60 while applying a high voltage between the heat dissipation plate 80 and all of the leads 60 that protrude from the semiconductor package 100. However, since usually the heat-resistant grease 85 is an electrical insulator, the above electrical insulation test cannot reflect the insulation property of the base insulation layer 20 exactly.

In addition, it may sometimes be desirable to electrically connect together the base metal layer 10 and the heat dissipation plate 80 and have the heat dissipation plate 80 grounded in order to provide the high power semiconductor package 100 with an external ground for attenuating electrical noise. However, for the package 100 shown in FIG. 1, it may be difficult to provide the base metal layer with the reliable external grounding if the heat-resistant grease 85 has electrical insulating properties.

SUMMARY OF THE INVENTION

The present invention provides a high power semiconductor package that is used with a heat dissipation plate, capable of providing a reliable electrical insulation test and a reliable external ground.

According to an aspect of the present invention, there is provided a high power semiconductor package including: a substrate including a base metal layer, a base insulation layer formed on the base metal layer, and a plurality of conductive patterns formed on the base insulation layer; one or more high power semiconductor chips mounted on the substrate, each including a plurality of bonding pads; one or more first leads having end portions that are electrically connected to the corresponding conductive patterns; and second lead having end portion electrically connected to the base metal layer.

The bonding pads may be electrically connected to the conductive patterns through first wires. The first leads may be connected to the conductive patterns using a soldering process and/or second wires.

The base insulation layer may include an opening exposing a surface of the base metal layer, and the surface of the base metal layer exposed by the opening may be directly connected to the second lead through a third wire.

The base insulation layer may include an opening exposing a surface of the base metal layer, the surface of the base metal layer exposed by the opening may be electrically connected to one of the conductive patterns through a third wire, and the second lead may be connected to the conductive pattern that is connected through the third wire using a soldering process.

The base insulation layer may include an opening exposing a surface of the base metal layer, a connection pad may be formed on the exposed surface of the base metal layer and the second lead may be connected to the connection pad using a soldering.

According to the high power semiconductor package of the present invention, the leads electrically connected to the base metal layer are formed, and thus, the insulation property of the base insulation layer in the high power semiconductor package can be tested by performing the processes of the electrical insulation test only between the leads. Accordingly, easy and reliable electrical insulation test processes can be provided according to the present invention.

In addition, according to the present invention, independent ground electrodes can be provided by the second leads that are electrically connected to the base metal layer, and thus, an external ground that is more reliable than the conventional ground through the heat-resistant grease can be achieved.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
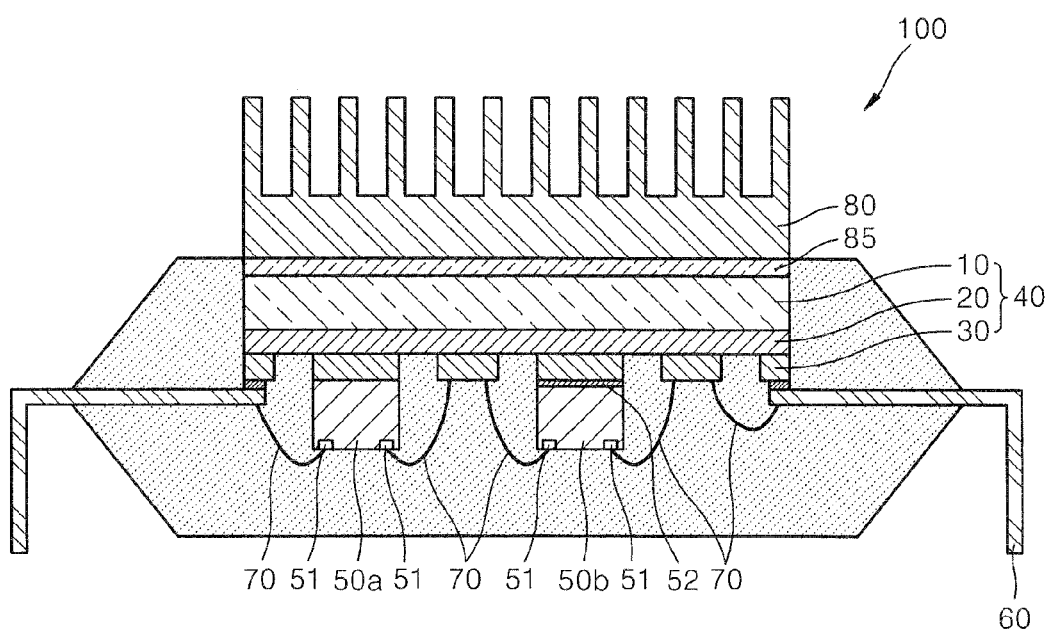
FIG. 1 is a cross-sectional view of a high power semiconductor package according to the conventional art.
Figure 2:
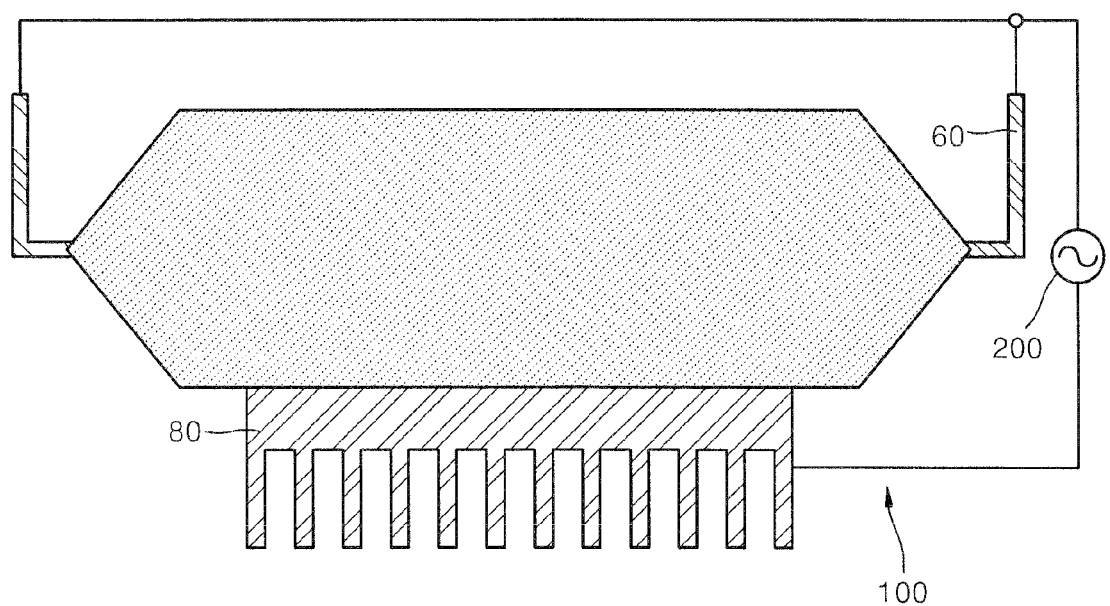
FIG. 2 is a schematic side view of a circuit for electrical insulation testing of the high power semiconductor package of FIG. 1.

The present invention will now be described more fully with reference to the accompanying drawings, in which exemplary embodiments of the invention are shown.

The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus repetitive descriptions will usually be omitted. The words "and/or" used in the present invention includes any and all combinations of one or more of the associated listed items.

In the present specification, terms such as first and second etc. are used to denote various members, components, layers, and/or parts, however, the members, components, layers, and/or parts are not limited by the above terms. The above terms are used only to distinguish one member, component, region, layer, or part from the other regions, layers, or parts. Therefore, a first member, component, region, layer, or part described hereafter can denote a second member, component, region, layer, or part without departing from teachings of the present invention.

Figure 3:
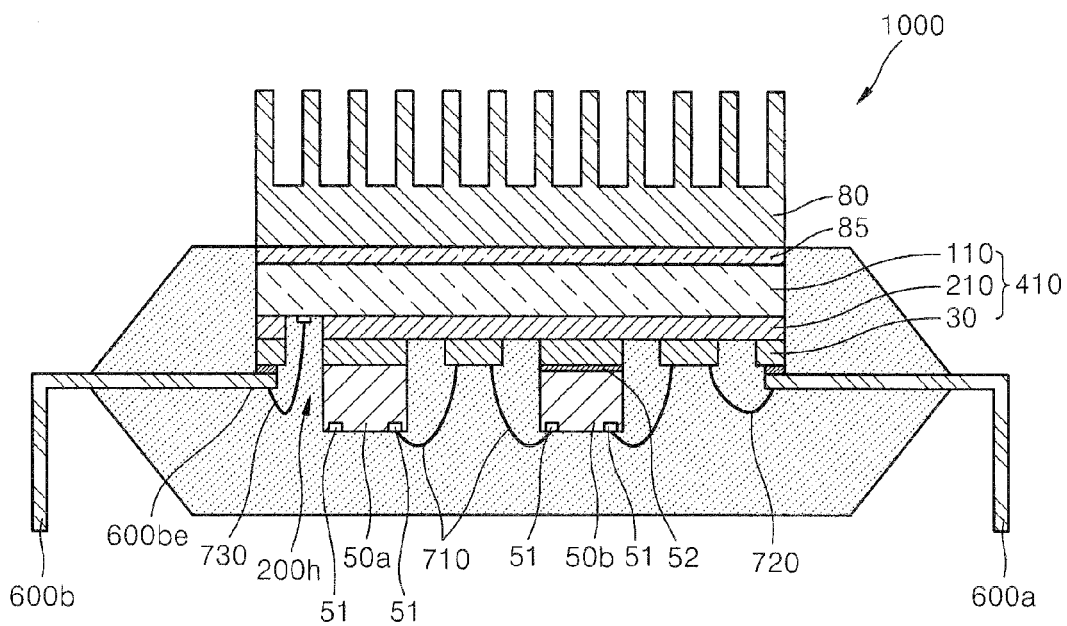
FIG. 3 is a cross-sectional side view of a high power semiconductor package according to an embodiment of the present invention.
Figure 4:
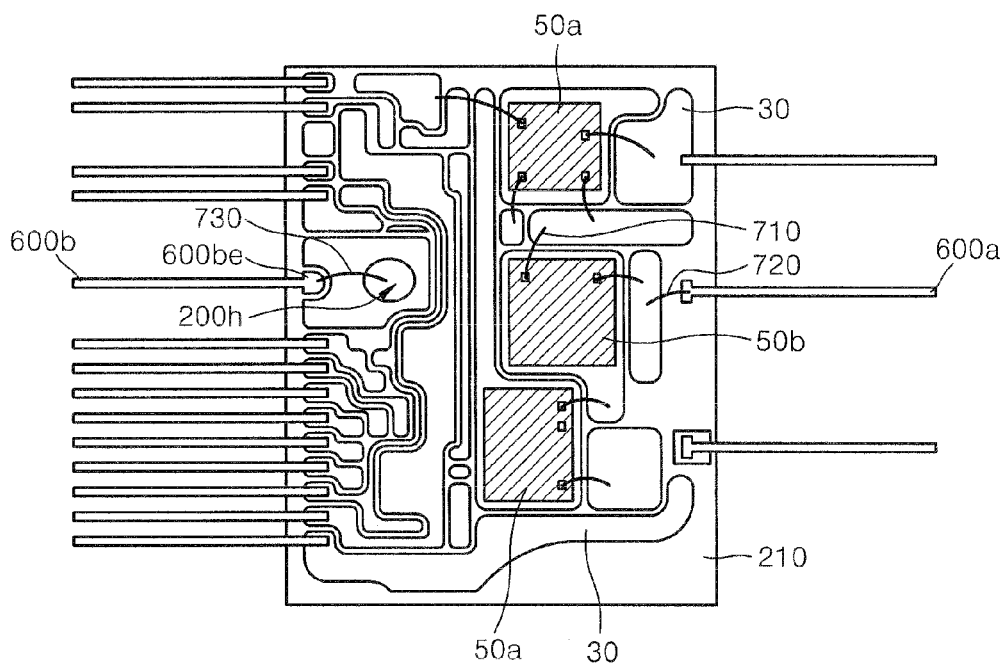
FIG. 4 is a cross-sectional plan view of an inner structure of a high power semiconductor package similar to the package shown in FIG. 3.

FIG. 3 is a cross-sectional view of a high power semiconductor package 1000 according to an embodiment of the present invention, FIG. 4 is a plan view of an inner structure of a high power semiconductor package similar to the package 1000 shown in FIG. 3.

Referring to FIGS. 3 and 4, a substrate 410 that is, for example, a printed circuit board or a ceramic substrate, includes a base metal layer 110, a base insulation layer 210 formed on the base metal layer 110, and conductive patterns 30 formed on the base insulation layer 210. The base metal layer 110 can be formed of a metal material having a high thermal conductivity, such as aluminum or copper. The base insulation layer 210 can be formed from a ceramic-based insulation material or a resin-based insulation material.

A high power semiconductor chip 50a can be mounted on the conductive pattern 30 providing a drain electrode. If necessary, a low power semiconductor chip 50b such as a driver integrated circuit (IC) for controlling and driving the high power semiconductor chip 500a can be mounted on the substrate 410. Accordingly, a smart power module can be constructed. An electrical insulation member 52 for insulating the conductive pattern 30 from the low power semiconductor chips 50b can be disposed between the conductive pattern 30 and the low power semiconductor chip 50b.

In addition, two or more high power semiconductor chips 50a and/or two or more low power semiconductor chips 50b can be stacked on the substrate 400. Wire bonding pads 51 formed on upper portions of the high power semiconductor chips 50a and/or the low power semiconductor chips 500b are electrically connected to the conductive patterns 30 through first bonding wires 710.

A plurality of leads, including leads 600a and 600b, provide the package 1000 with external terminals. First lead 600a of the leads 600a and 600b may be leads for inputting/outputting signal and/or power, which are electrically connected to bonding pads 51 of the high power semiconductor chip 50a and the low power semiconductor chip 50b through the second bonding wire 720 as in a conventional high power semiconductor package 100 described in FIG. 1.

Second lead 600b of the leads 600a and 600b may be electrically connected to the base metal layer 110. For example, an opening 200h exposing a surface of the base metal layer 110 is formed on the base insulation layer 210, and the surface of the base metal layer 110 exposed by the opening 200h and the second lead 600b can be electrically connected directly to the base insulation layer 210 through a third bonding wire 730. In other embodiments, the surface of the base metal layer 210 exposed by the opening 200h is electrically connected to one of the conductive patterns 30 through a third bonding wire 730, and the second lead 600b is connected to the conductive pattern 30 using a soldering process.

In order to connect the bonding wire 730 to the second lead 600b easily, an expanded contact region 600be for ensuring an area contacting the bonding wire 730 can be formed on an end portion of the lead 600b. In addition, as shown in FIG. 3, the base insulating layer 210 and the conductive pattern 30 have an opening for the lead 600b.

FIGS. 3 and 4 illustrate the leads 600a and 600b protruding from both sides of the high power semiconductor packages, alternatively, the leads 600a and 600b may be formed on only one side or on the bottom side of the high power semiconductor packages. Thus, the leads 600a and 600b may be protruded outwardly from the high power semiconductor package 1000 in various configurations. The configuration of the leads 600a and 600b does not limit the scope of the present invention. After performing the above wire bonding process and cutting the leads 600a and 600b to the desired length, a transfer molding process using an EMC is performed to complete the fabrication of the high power semiconductor package 1000.

Figure 5:
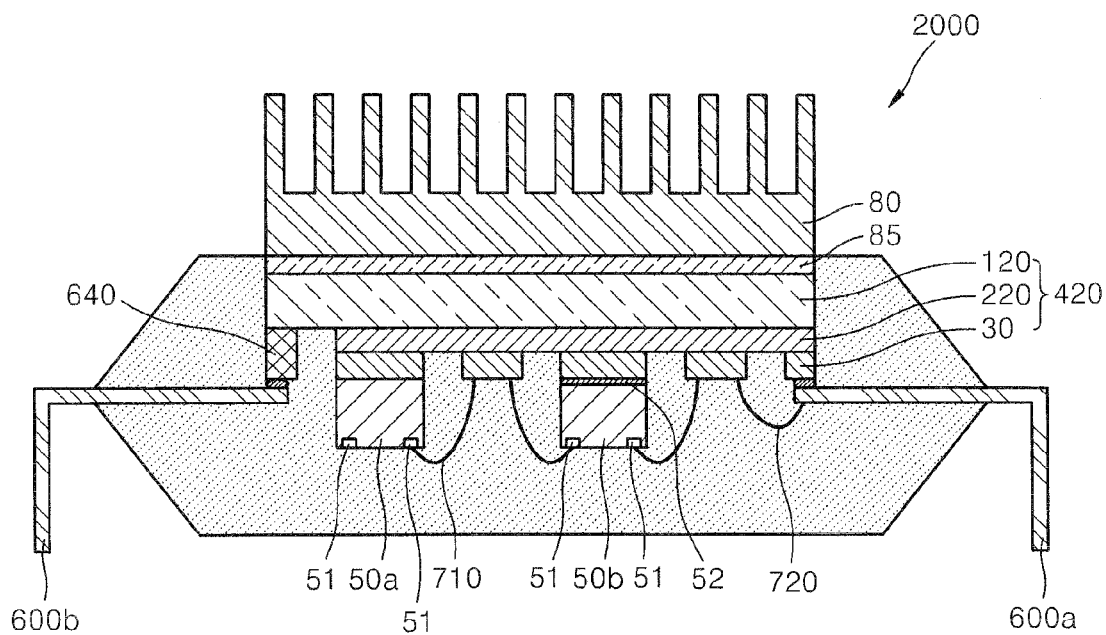
FIG. 5 is a cross-sectional side view of a high power semiconductor package according to another embodiment of the present invention.
Figure 6:
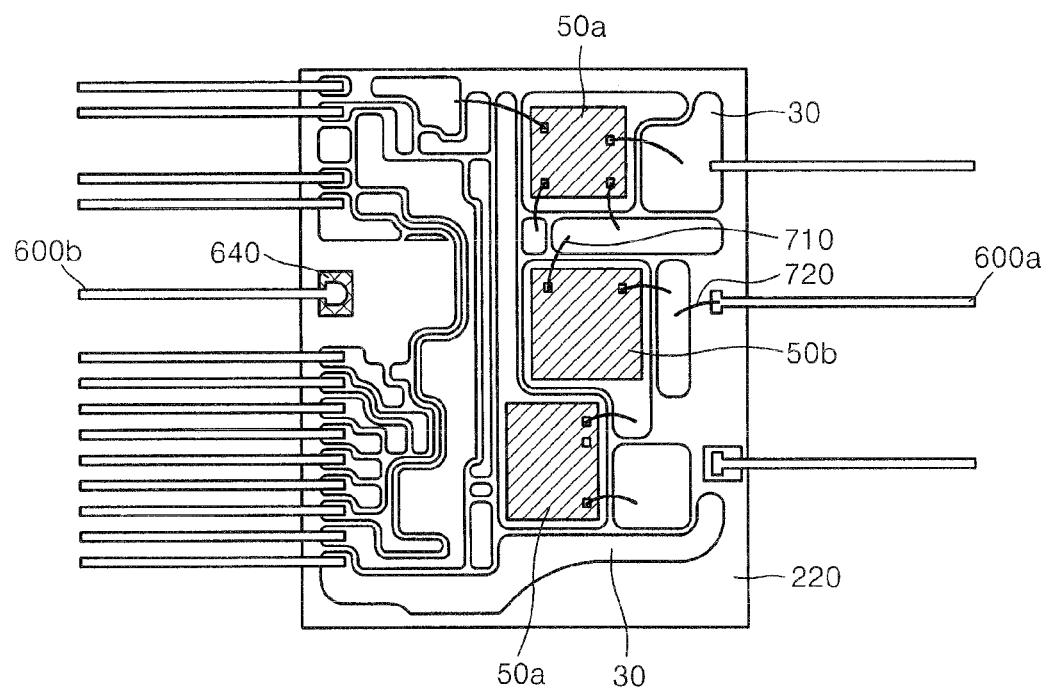
FIG. 6 is a cross-sectional plan view of an inner structure of a high power semiconductor package similar to the package shown in FIG. 5.

FIG. 5 is a side cross-sectional view of a high power semiconductor package 2010 according to another embodiment of the present invention, and FIG. 6 is a plan cross-sectional view of an inner structure of a high power semiconductor package 2010 similar to the package 2000 of FIG. 5.

In FIGS. 5 and 6, as in FIGS. 3 and 4, a high power semiconductor chip 50*a* and/or a lower power semiconductor chip 50*b* can be mounted on a substrate 420. Two or more high power semiconductor chips 50*a* and/or two or more low power semiconductor chips 50*b* can be mounted, and can be stacked on the substrate 420 respectively. Bonding pads 51 formed on upper portions of the high power semiconductor chip 50*a* and/or the low power semiconductor chip 50*b* can be electrically connected to conductive patterns 310 through first bonding wires 710.

A plurality of leads, including leads 600*a* and 600*b*, are disposed in the high power semiconductor package 2010. The first lead 600*a* may be a lead which is electrically connected to the bonding pads 51 of the high power semiconductor chip 50*a* or the low power semiconductor chip 50*b*, for inputting/outputting signals or electric power. The first lead 600*a* can be electrically connected to one of the bonding pads 51 using solder and/or second bonding wires 720.

In order to connect the second lead 600*b* to the base metal layer 120, a part of the base insulation layer 220, for example, an edge portion of the base insulation layer 220, can be removed to expose a surface of the base metal layer 120. A connection pad 640 that can be electrically connected to the second lead 600*b* is formed on the exposed surface of the base metal layer 120, and the second lead 600*b* and the connection pad 640 are bonded to each other using, for example, a soldering process or metal bumping process, and thus, the base metal layer 120 can be electrically connected to the second lead 600*b*.

FIGS. 5 and 6 illustrate the leads 600*a* and 600*b* protruding from both sides of the high power semiconductor packages, however, the leads 600*a* and 600*b* can be formed only on one side or on the bottom side of the high power semiconductor packages. After performing the above wire bonding process and cutting the leads 600*a* and 600*b*, a transfer molding process for injecting an EMC is performed to complete the fabrication of the high power semiconductor package 2000.

The second leads 600*b* of the embodiments of the present invention can be used as grounding electrodes for attenuating electrical noise. In addition, some of the conductive patterns 310 that are electrically connected to the semiconductor chips 50*a* and 50*b* can be connected to the second leads 600*b* in order to provide the high power semiconductor package 2010 with common ground electrodes.

In the above embodiments, the substrate is not limited to the printed circuit board, and a lead frame that is a support member of the high power semiconductor chip may be used as the substrate of the present invention.

According to the high power semiconductor package of the present invention, the leads electrically connected to the base metal layer are formed, and thus, the insulation property of the base insulation layer in the high power semiconductor package can be tested by performing the processes of electrical insulation test only between the leads. Accordingly, an easy and reliable electrical insulation test process can be provided according to the present invention.

In addition, according to the present invention, independent ground electrodes can be provided by the leads that are electrically connected to the base metal layer to provide external grounding that is more reliable than the conventional grounding through the heat-resistant grease.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high power semiconductor package comprising:
   a substrate including a base metal layer, a base insulation layer formed on the base metal layer, the base insulation layer having a first side in contact with the base metal layer, and a plurality of conductive patterns formed on a second side of the base insulation layer wherein the base metal layer is electrically isolated from all conductive patterns formed of the second side of the base insulation layer;
   one or more high power semiconductor chips mounted on the substrate, each including a plurality of bonding pads;
   one or more first leads having end portions that are electrically connected to the corresponding conductive patterns; and
   second lead having end portion electrically connected to the base metal layer via an opening in the base insulation layer that exposes a portion of the surface of the base metal layer at the first side of the insulation layer.

2. The semiconductor package of claim 1, wherein the bonding pads are electrically connected to at least one of the conductive patterns through first wires.

3. The semiconductor package of claim 1, wherein the first leads are connected to the conductive patterns using a soldering process and/or second wires.

4. The semiconductor package of claim 1, wherein the portion of the surface of the base metal layer exposed by the opening is directly connected to the second lead through a third wire.

5. The semiconductor package of claim 1, wherein the portion of the surface of the base metal layer exposed by the opening is electrically connected to one of the conductive patterns through a third wire, and the second lead is connected to the conductive pattern that is connected through the third wire using a soldering process.

6. The semiconductor package of claim 1, wherein the base insulation layer includes an opening exposing a surface of the base metal layer, a connection pad is formed on the exposed surface of the base metal layer and the second lead is connected to the connection pad using a soldering process.

7. The semiconductor package of claim 1, wherein the second lead is a grounding terminal.

8. The semiconductor package of claim 1, further comprising:
   a low power semiconductor chip on the substrate.

9. The semiconductor package of claim 1, wherein a heat dissipation plate is attached on the surface of the base metal layer opposite to the base insulation layer.

10. The semiconductor package of claim 1, wherein the high power semiconductor package is sealed by a transfer molding process.

11. A method for making a high power semiconductor package comprising the steps of:
    forming a substrate comprising a layer of base metal in contact with a first side of an insulating layer, the other side of the insulating layer in contact with a plurality of conductive patterns wherein the base metal layer is electrically isolated from all conductive patterns in contact with the second side of the base insulation layer;

forming an opening through the insulating layer to expose a portion of a surface of the base metal layer at the first side of the insulation layer;

attaching a power device to one of the plurality of conductive patterns;

electrically connecting a first external terminal to the power device; and electrically connecting a second external terminal to the portion of the surface of the layer of base metal.

12. The method of claim 11 wherein the external terminal is connected to the portion of the surface of the layer of base metal with a bonding wire.

13. The method of claim 11 further including the step of attaching a low power semiconductor chip to another of the plurality of conductive patterns.

14. The method of claim 11 further including the step of attaching a heat dissipation plate on the surface of the base metal layer opposite to the base insulation layer.

15. The method of claim 11 further including the step of sealing the high power semiconductor package by a transfer molding process.

16. The method of claim 11 further including the step of forming a connection pad on the portion of the surface of the base metal layer, wherein the second external terminal is connected to the connection pad using a soldering process.

* * * * *